United States Patent [19]

Chang et al.

[11] Patent Number: 5,406,517
[45] Date of Patent: Apr. 11, 1995

[54] DISTRIBUTED NEGATIVE GATE POWER SUPPLY

[75] Inventors: Chung K. Chang, Sunnyvale; Johnny C. Chen, Cupertino; Michael A. Van Buskirk, San Jose; Lee E. Cleveland, Santa Clara, all of Calif.

[73] Assignee: Advanced Micro Devices, Inc., Sunnyvale, Calif.

[21] Appl. No.: 109,881

[22] Filed: Aug. 23, 1993

[51] Int. Cl.$^6$ ............................................. G11C 13/00
[52] U.S. Cl. .............................. 365/189.09; 365/185; 365/218; 365/226; 365/900
[58] Field of Search .................... 365/185, 189.09, 218, 365/226, 227, 900

[56] References Cited

U.S. PATENT DOCUMENTS

| | | | |
|---|---|---|---|
| 5,077,691 | 12/1991 | Haddad et al. | 365/218 |
| 5,168,466 | 12/1992 | Kuo et al. | 365/185 |
| 5,282,170 | 1/1994 | Van Buskirk et al. | 365/226 |

Primary Examiner—Joseph A. Popek
Attorney, Agent, or Firm—Davis Chin

[57] ABSTRACT

A distributed negative gate power supply for generating and selectively supplying a relatively high negative voltage to control gates of memory cells in selected half-sectors via wordlines in an array of flash EEPROM memory cells during flash erasure. The distributed negative gate power supply includes a main charge pumping circuit (20a, 20b), a plurality of distribution sector pumping means (18a–18p). Each of the plurality of distribution sector pumping circuits is responsive to a half-sector select signal for selectively connecting the primary negative voltage to the wordlines of the selected half-sectors.

19 Claims, 9 Drawing Sheets

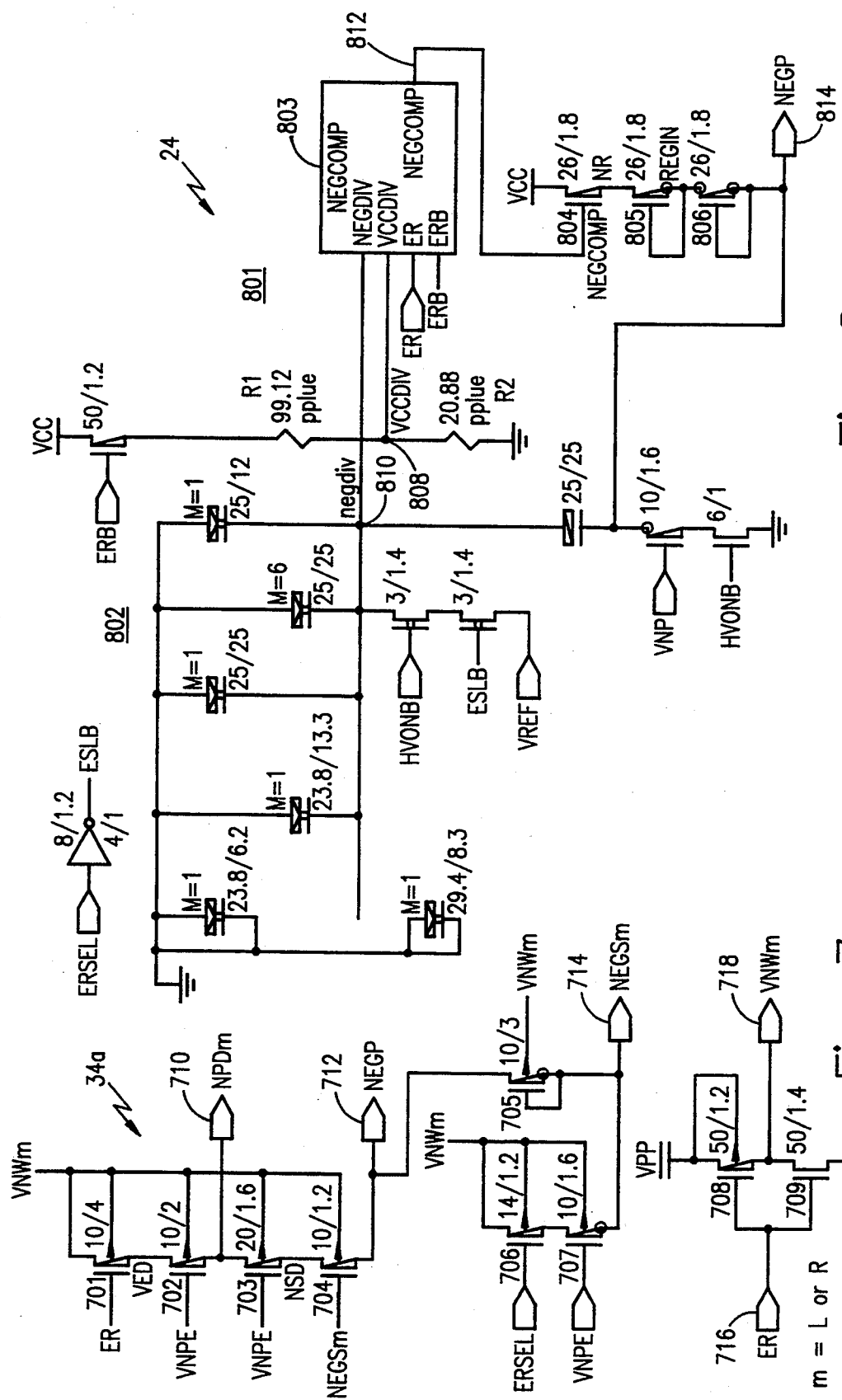

DISTRIBUTED NEGATIVE GATE POWER SUPPLY

BACKGROUND OF THE INVENTION

1. Field of the Invention

This invention relates generally to floating gate memory devices such as an array of flash electrically erasable programmable read-only memory (EEPROM) cells with page erase and negative voltage gate erase. More particularly, the present invention relates to a distributed negative gate power supply for generating and selectively supplying a relatively high negative voltage to control gates of memory cells in selected half-sectors via wordlines in an array of flash EEPROM memory cells during flash erasure.

2. Description of the Prior Art

In and commonly assigned U.S. application Ser. No. 07/964,807 to M. A. Van Buskirk et al. entitled "Negative Power Supply" and filed on Oct. 22, 1992, now U.S. Pat. No. 5,282,170, there is described a negative power supply for generating and supplying a regulated potential to control gates of selected memory cells via wordlines in an array of flash EEPROM memory cells during flash erasure. This application Ser. No. 07/964,807 is hereby incorporated by reference in its entirety. In FIG. 1 of the '807 application, there is shown a block diagram of the negative power supply 10 which includes a clock circuit 14 for generating a plurality of clock signals and a charge pumping circuit 12 responsive to an external power supply potential VCC and to the clock signals for generating a high negative voltage. A cancellation circuit is coupled to the charge pumping circuit for effectively canceling out threshold voltage drops therein.

The charge pumping circuit 12 of the '807 application is formed of a plurality of charge pumping stages. A negative well circuit 20 is coupled to the plurality of charge pumping stages for preventing initially the operation of a certain number of the plurality of charge pumping stages during erasure. A regulator circuit 16 is responsive to the high negative voltage and a reference potential for generating a negative comparator signal which is either at a high level so as to allow the charge pumping circuit to increase the high negative voltage or at a low level so as to decrease the high negative voltage and for generating the regulated negative potential that is independent of the power supply potential VCC.

The charge pumping circuit 12 and the negative well circuit 20 represents only one of the sixteen charge pumping circuits used on the integrated circuit chip containing the array of flash EEPROM memory cells. Each one of the charge pumping circuits is associated with one of the eight half-sectors in either the left or right side of the array. Further, the high negative voltage NEGOUT from each of the pumping circuits is coupled to the wordlines via a plurality of diode-connected P-channel transistors P9 as shown in FIG. 4(c) of the '807 application. One of the disadvantages in this prior art negative power supply utilizing 16 charge pumping circuits is that a large amount of space is required on the integrated circuit chip. Further, there are accompanying drawbacks of high power consumption and high heat dissipation. In addition, there exists another drawback due to the diode connected transistor causing a voltage drop $V_t$ dependency of the wordline voltage during erase.

The present invention represents a significant improvement over the prior art negative power supply discussed above in the '807 application. The distributed negative gate power supply of the present invention is used for generating and selectively supplying a relative high negative voltage to control gates of memory cells in selected half-sectors via wordlines in an array of flash EEPROM memory cells during flash erasure. The distributed negative gate power supply includes a main charge pumping circuit for generating a relatively high primary negative voltage and a plurality of distribution sector pump circuits, each corresponding to one of the half-sectors. The distribution sector pump circuit is used to selectively connect the primary negative voltage to the wordlines of the selected half-sectors.

SUMMARY OF THE INVENTION

Accordingly, it is a general object of the present invention to provide a distributed negative gate power supply for generating and selectively supplying a relatively high primary negative voltage to control gates of memory cells in selected half-sectors via wordlines in an array of flash EEPROM memory cells during flash erasure, but yet overcomes the disadvantages of the prior art negative power supplies.

It is an object of the present invention to provide a distributed negative gate power supply for generating and selectively supplying a relatively high primary negative voltage which occupies a smaller amount of space on an integrated circuit chip than has been traditionally available.

It is another object of the present invention to provide a distributed negative gate power supply for generating and selectively supplying a relatively high primary negative voltage which eliminates the threshold drop $V_t$ dependence of the wordline voltage during erase.

It is still another object of the present invention to provide a distributed negative gate power supply for generating and selectively supplying a relatively high primary negative voltage formed of a main charge pumping circuit for generating the primary negative voltage and a plurality of distribution sector pump circuits for selectively connecting the primary negative voltage to the wordlines of the selected half-sectors.

In accordance with these aims and objectives, the present invention is concerned with the provision of a distributed negative gate power supply for generating and selectively supplying a relatively high primary negative voltage to control gates of memory cells in selected half-sectors via wordlines in an array of flash EEPROM memory cells during flash erasure. The distributed negative gate power supply includes a clock circuit for generating a plurality of clock signals and a main charge pumping circuit responsive to an external power supply potential and to the clock signals for generating a relatively high primary negative voltage. A sector logic circuit is provided for generating half-sector select signals, each corresponding to a selected half-sector. A plurality of distribution sector pump circuits is responsive to the half-sector select signals for selectively connecting the primary negative voltage to the wordlines of the selected half-sectors.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein:

FIG. 7 is a circuit diagram of one of the negative well circuits of FIG. 2 for generating the signals VNW and NPD;

FIG. 8 is a circuit diagram of the negative regulator circuit of FIG. 2;

DESCRIPTION OF THE PREFERRED EMBODIMENT

Figure 1:
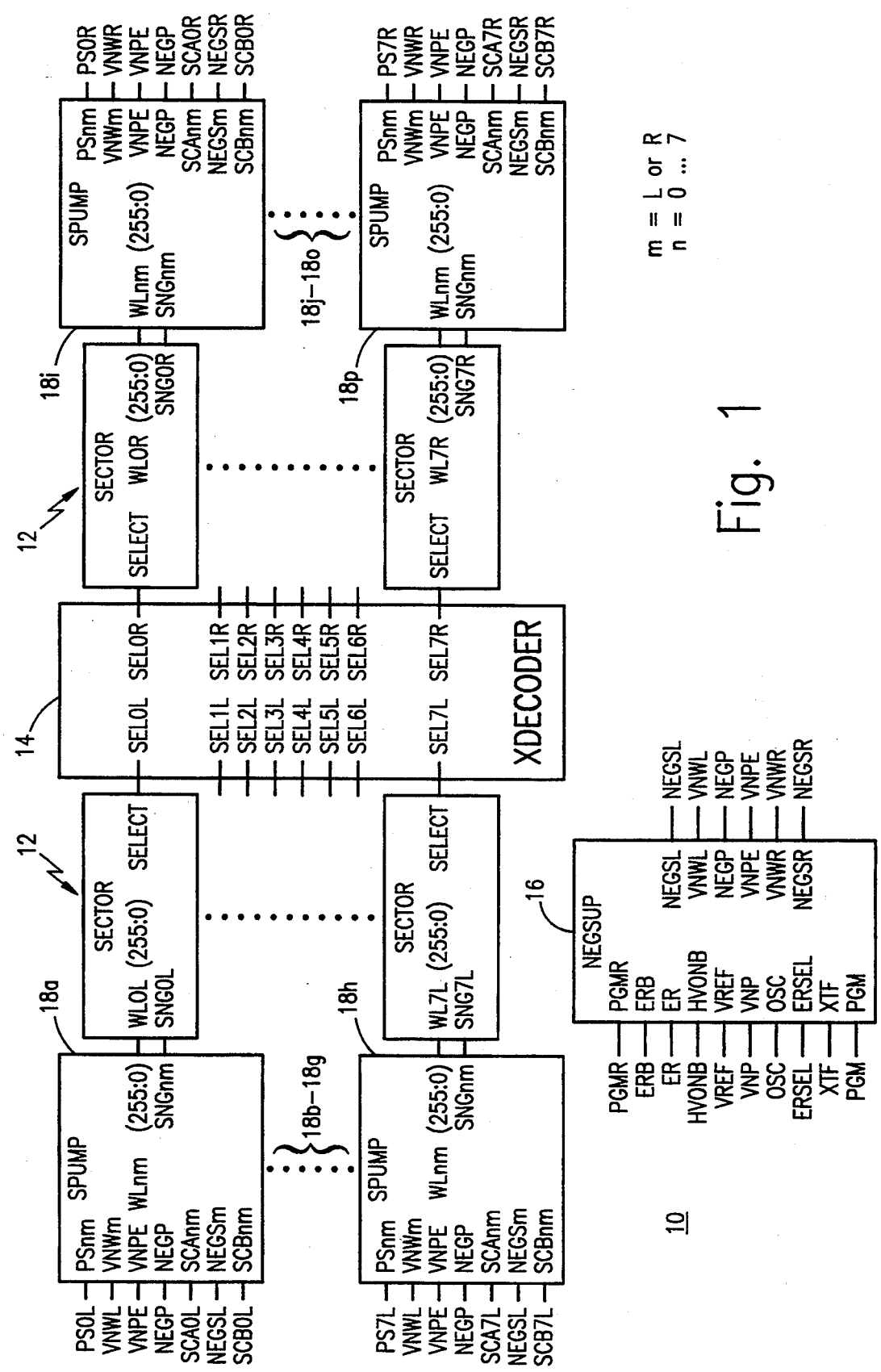
FIG. 1 is a chip layout diagram illustrating how the distributed negative gate power supply of the present invention is positioned relative to the sector drive circuitry of a semiconductor integrated circuit.

Referring now in detail to the drawings, there is illustrated in FIG. 1 a chip layout of how a distributed negative gate power supply 10 of the present invention is positioned relative to sector drive circuitry 12 and a row decoder 14, all formed as a part of a single semiconductor integrated circuit chip (not shown). The distributed negative gate power supply 10 is used for generating and selectively supplying a relatively high primary negative voltage NEGP to control gates of memory cell transistors in selected half-sectors to wordlines during flash erase mode of operation.

The semiconductor integrated circuit chip also contains an array having a large number of flash EEPROM memory cells arranged in an N×M matrix. An external or off-chip power supply potential VCC (also not shown) which is typically at +5.0 V, is supplied to the integrated circuit chip and is fed to the input of the distributed negative gate power supply 10. The array of the flash EEPROM memory cells is formed on a substrate to define columns and rows, where the substrate includes a common source line extending along at least one of the rows and a plurality of bit lines extending along respective columns. Each of the memory cells includes an N-type source region coupled to the common source line, a control gate, a floating gate, a channel region and an N-type drain region coupled to a respective one of the bit lines. Further, each of the memory cells is programmable predominately by transferring hot electrons into its floating gate and is erasable predominantly by tunneling electrons from its floating gate to its source region.

It should be noted that where the memory array is, for example, physically arranged in a matrix of 1024 rows by 1024 columns, a predetermined number of rows may be grouped together so as to form a sector defining a page-selectable erase block. For instance, the 1024 rows may be divided into 8 sectors with each sector being composed of an equal number of rows (128 each). However, it should be apparent to those skilled in the art that each sector could be formed with an unequal number of rows. Further, the columns may be broken into segments so that each sector has a left side and a right side (half-sectors).

Unlike the prior negative power supply in application Ser. No. 07/964,807 which utilized a plurality of independent multi-state charge pump circuits (one for each half-sector), the distributed negative gate power supply 10 of the present invention is composed of a separate large main pump circuit 16 and a plurality of relatively small-size, single-stage distribution sector pump circuits 18a–18p for selectively distributing the primary negative voltage NEGP. In this manner, the amount of chip area required on the integrated circuit has been significantly reduced. Further, there is achieved a substantial reduction in power consumption and heat dissipation through the implementation of the distribution sector pump circuits. In addition, the negative gate power supply includes means for generating a discharge voltage which is initially pulled up to a small negative voltage so as to allow the primary negative voltage to discharge sufficiently before it is pulled to the positive external power supply potential, thereby avoiding excessive stress on the oxides.

Figure 2:
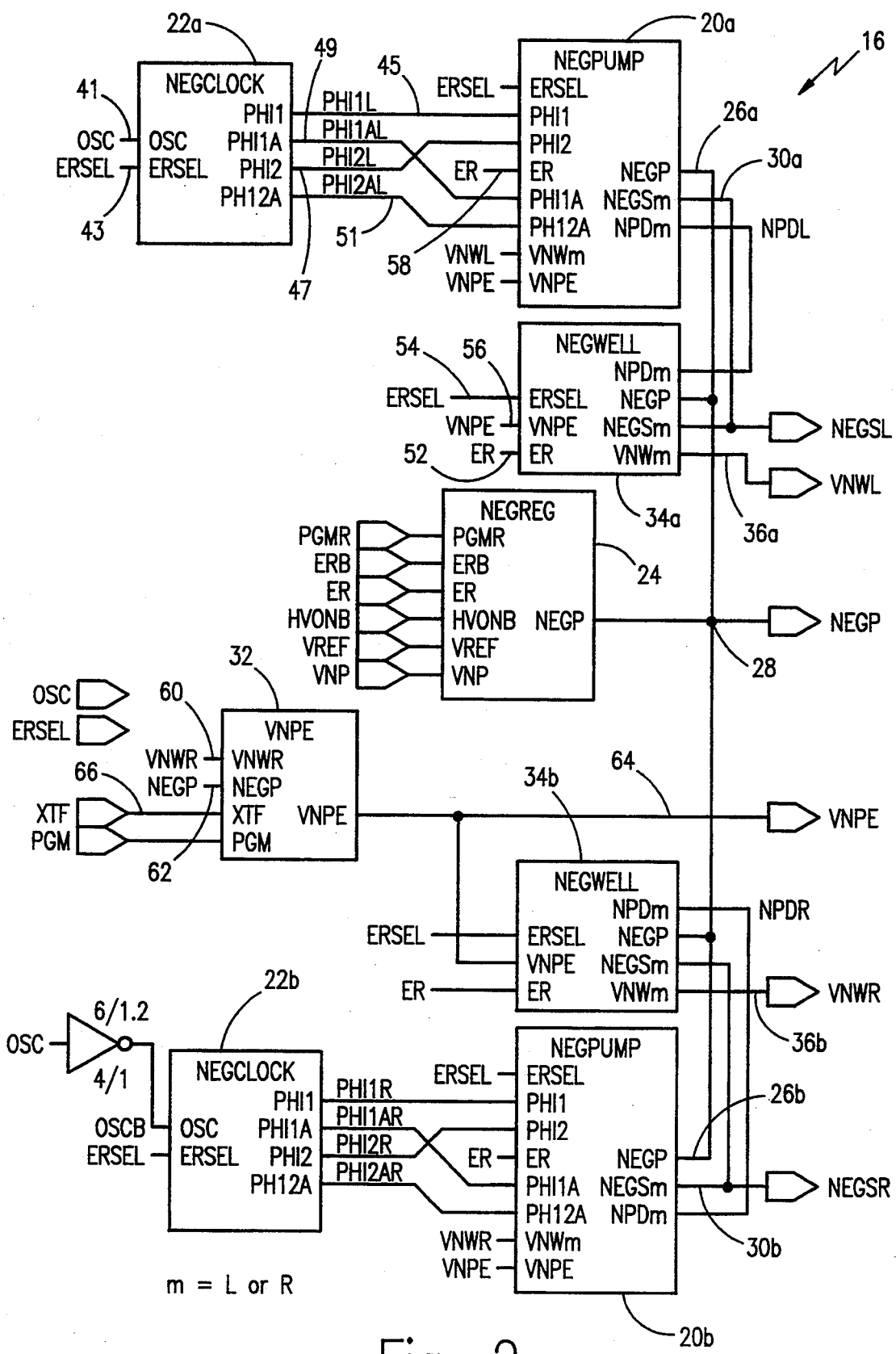
FIG. 2 is a block diagram of the main negative pump circuit 16 of FIG. 1.

In FIG. 2, there is shown a block diagram of the main pump circuit 16 of FIG. 1. The main pump circuit 16 includes two identical negative pumping circuits 20a and 20b, each being responsive to a respective one of the clock circuit 22a and 22b for generating a relatively high primary negative voltage NEGP. It will be noted that the negative pumping circuit 20a is associated with the left side of the array and the negative pumping circuit 20b is associated with the right side thereof. Further, the primary negative voltage NEGP on output lines 26a and 26b are tied together at node 28. The main pump circuit 16 includes a negative regulator circuit 24 which is used to regulate the primary negative voltage NEG to approximately −10.5 volts. The negative pumping circuits 20a and 20b also generate respective secondary negative voltages NEGSL and NEGSR on corresponding lines 30a and 30b, which are more negative than the primary negative voltage NEGP (i.e., about −14 V).

In addition, the main pump circuit 16 has a protection circuit 32 which is responsive to the primary negative voltage NEGP for generating an intermediate negative protection voltage (approximately −6 V) so as to provide protection of the oxide of the P-channel pull-up devices in the sector pump circuits. Negative well circuits 34a and 34b are used to generate respective negative well voltages VNWL and VNWR on respective lines 36a and 36b so as to ground the N-wells of the main and sector pump circuits during erase. Thus, it can be seen that the circuits 20a, 34a and 22a are associated with all of the half-sectors on the left side of the array and that the circuits 20b, 34b and 22b are associated with the half-sectors on the right side of the array. The circuits 24 and 32 are each used only once for the entire array.

Figure 3A:
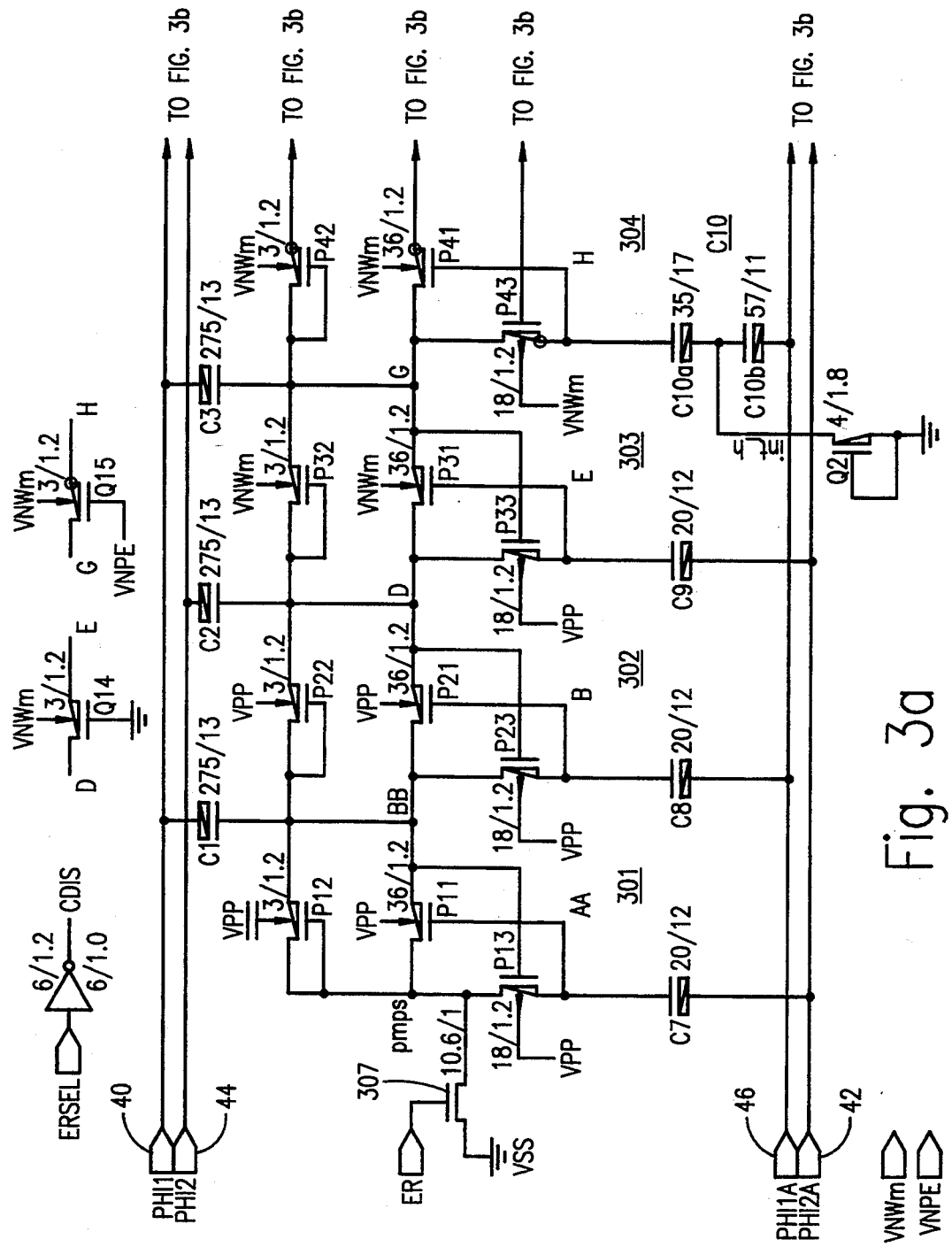
FIG. 3(a) and 3(b) are a detailed schematic diagram of one of the negative charge pumping circuits in the main negative pump circuit of FIG. 2.
Figure 3B:
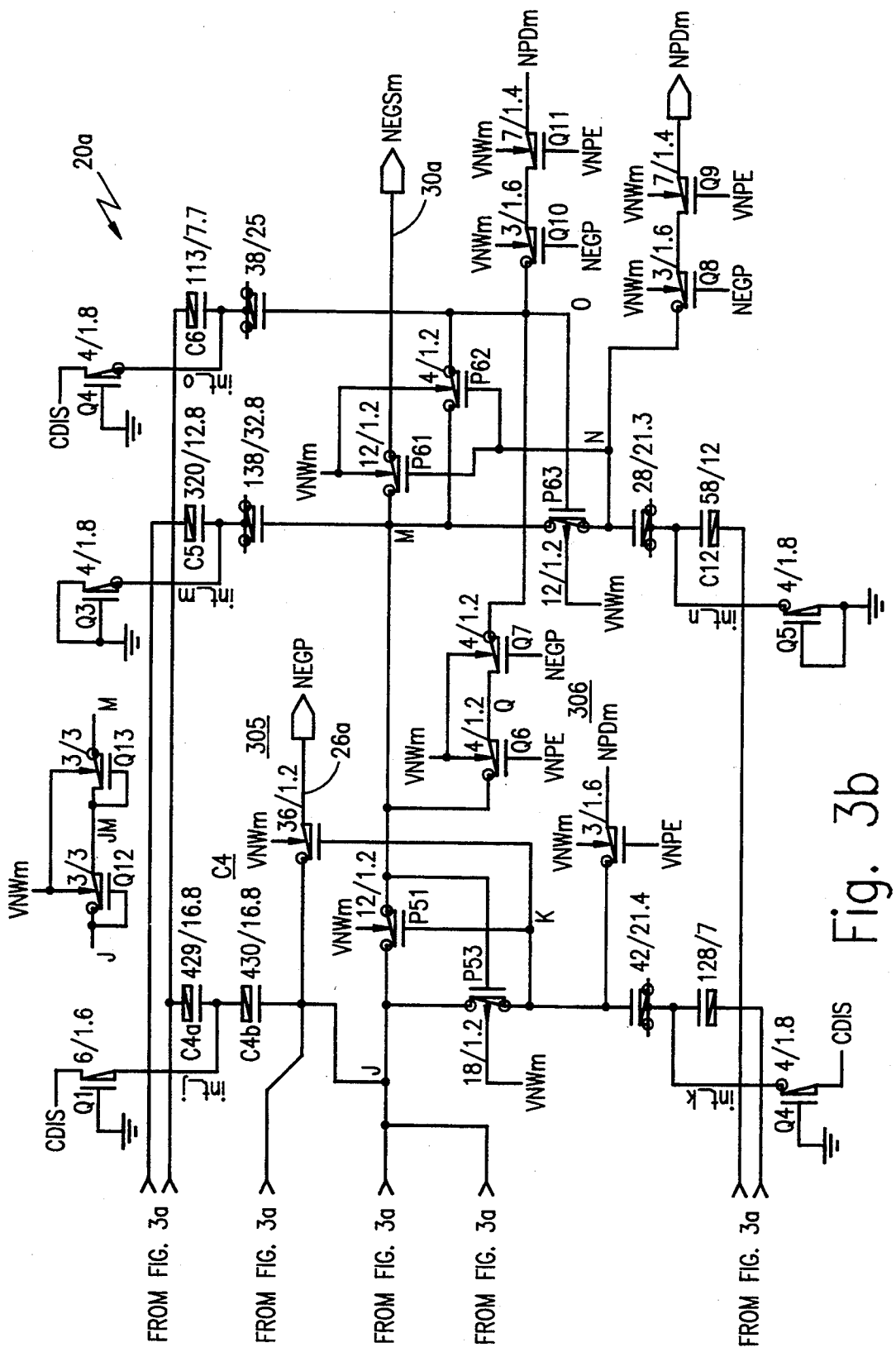

Since the negative pumping circuits 20a and 20b are identical in their construction and operation, it will be sufficient to describe only the pumping circuit 20a. Referring now to FIG. 3, there is depicted a detailed schematic circuit diagram of the negative pumping circuit 20a. The negative pumping circuit includes four stages 301, 302, 303 and 304. An output transistor 305 is coupled to the output of the fourth stage 304 for generating the relatively high primary negative voltage NEGP on the output line 26a, which is approximately −10.5 volts. An output buffer stage 306 is also coupled to the output of the fourth stage 304 for generating the secondary negative voltage NEGSm, which is approximately −14 volts. The input of the pumping circuit 20a is at input node pmps. An N-channel pump select transistor 307 has its drain connected to the input node pmps, its gate connected to receive the erase signal ER and its source connected to the lower power supply potential VSS(gnd). The pumping circuit 26a is turned on when the erase signal ER is high so as to render conductive the pump select transistor 307, thereby creating a current path to the lower power supply potential VSS. In the non-erase modes, the pump select transistor 307 is turned off so as to prevent any dc current path from the upper power supply potential VPP.

The first stage 301 is formed of a P-channel pass transistor P11, a P-channel initialization transistor P12, a P-channel pre-charge transistor P13, and a pair of coupling capacitors C1, C7. The pass transistor P11 has its source connected to the input node pmps, its drain connected to an output/input node BB, and its gate connected to an internal node AA. The initialization transistor P12 is a diode-connected transistor in which its drain and gate are connected together and to the source of the transistor P11. The source of the transistor P12 is connected to the drain of the transistor P11 and to the gate of the transistor P13. The transistor P13 has its drain connected to the internal node AA and to the gate of the transistor P11. The transistor P13 has its source connected to the source of the transistor P11 and to the drain of the transistor P12. The N-well of the transistors P11–P13 are connected to the upper power supply potential VPP. The coupling capacitor C1 is coupled between the output node BB and an input node 40 for receiving the clock signal PHI1. The coupling capacitor C7 is coupled between the internal node AA and an input node 42 for receiving the clock signal PHI2A. Each of the coupling capacitors C1 and C7 are formed of a MOS transistor.

The second stage 302 is identical in its construction to the first stage 301 and includes P-channel transistors P21, P22 and P23 and coupling capacitors C2 and C8. The input of the second stage 302 is at the output/input node BB and the output thereof is at output/input node D. The coupling capacitor C2 is coupled between the output node D and an input node 44 for receiving the clock signal PHI2. The coupling capacitor C8 is coupled between the internal node B and an input node 46 for receiving the clock signal PHI1A. The third stage 303 is likewise identical in its construction to the first stage 301 and includes P-channel transistors P31, P32 and P33 and coupling capacitors C3 and C9. The input of the third stage 303 is at the node D, and the output thereof is at the output/input node G. The coupling capacitor C3 is connected between the output node G and the input node 40 for receiving the clock signal PHI1. The coupling capacitor C9 is connected between the internal node E and the input node 42 for receiving the clock signal PHI2A. The N-well of the transistors P31, P32 and P33 are tied to the negative well voltage VNWm rather than to the supply potential VPP so as to prevent junction breakdown.

The fourth stage 304 is quite similar in its construction to the first stage 301 and includes P-channel transistors P41, P42 and P43 and coupling capacitors C4, C10. The input of the fourth stage is at the node G, and the output thereof is at the output/input node J. A coupling capacitor C4 is coupled between the node J and the input node 44 for receiving the clock signal PHI2. The coupling capacitor C10 is connected between the internal node H and the input node 46 for receiving the clock signal PHI1A. It will be noted that the capacitors C4 and C10 are formed by respective stacked capacitors C4a, C4b and C10a, C10b since the field at the nodes J and H are quite high. The internal node intj is initially tied to the signal CDIS via the transistor Q1, and the internal node inth is tied to the ground potential via the diode-connected transistor Q2. The source/drain junction of the transistors P41, P42 and P43 are "donuted" so as to increase the junction breakdown voltage. The term "donut" refers to encircling the source/drain junction with polysilicon.

The output transistor 305 has its source connected to the output node J and its drain connected to the output line 26a for generating the primary negative voltage NEGP. The gate of the transistor 305 is connected to an internal node K. The N-well of the transistor 305 is also connected to the N-well voltage VNWm. The output buffer stage 306 includes a first buffer stage 306a and a second buffer stage 306b, each being similar in construction to the fourth stage 304. The first buffer stage 306a is formed of transistors P51, P53 and stacked capacitors C5, C11. The input of the stage 306a is at the output node J and the output thereof is at output/input node M. The internal nodes intm and intk are initialized by the transistors Q3, Q4. Similarly, the second buffer stage 306b is formed of P-channel transistors P61, P62 and P63 and stacked capacitors C6, C12. The internal nodes into and intn are initialized by the transistors Q4, Q5.

After the erase mode, the high negative voltages must be discharged from the pumping circuit 20a. It will be noted that the signal CDIS (complement of ERSEL) is used to discharge the intermediate nodes of the capacitors C4–C6, C10–C12 during the non-erase mode. However, the internal nodes M and N will not be discharged because the clock signals PHI1 and PHI1A are low during the non-erase mode. If the output node of a particular pump stage is pulled high, the associated pre-charge transistor will be turned off and the negative voltage will be trapped at the intermediate node connected to the pre-charge capacitor. In order to solve this problem, there are provided discharge transistors Q6, Q7, QS, Q9, Q10, Q11 and Q12 which serve to pull up nodes K, N, and 0 through the discharge signal NPDm. The discharge signal NPDm is used to discharge the most negative nodes of the capacitors which would otherwise be trapped at a negative voltage and exceed the oxide breakdown voltage of the transistors. During discharge, the discharge signal NPDm is initially approximately −2.5 volts and is pulled up later to the upper power supply potential VPP when the pump output nodes have discharged sufficiently.

The discharge transistors Q6 and Q7 will bring up the node M to the potential VPP when the node N has been pulled up to the potential VPP. However, the transistor P53 will be caused to turn off so that the node K will not discharge the node J. This problem is eliminated by the provision of two diode-connected transistors Q13a, Q13b which creates a more resistive path between the nodes M and J. Further, during discharge the transistor Q14 connected between the nodes D and E and the transistor Q15 connected between the nodes G and H will be turned on so as to discharge the nodes E and H. The clock signals are turned on by the erase select signal ERSEL which remains ON for an additional time after erasing ER so that the pumping circuit 20a can be discharged properly.

Figure 4A:
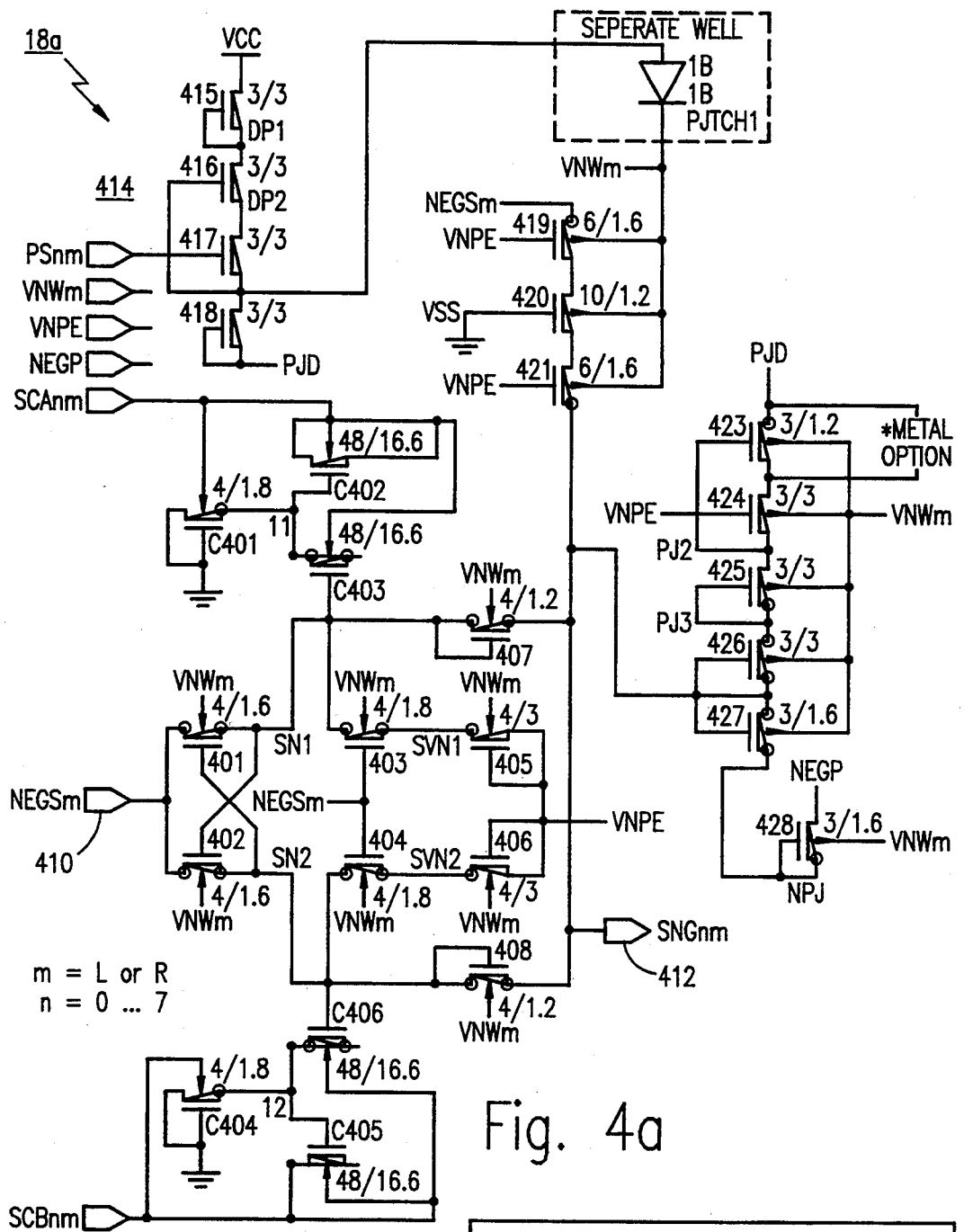
FIG. 4(a) is a detailed schematic circuit diagram of one of the sixteen sector distribution sector pump circuits 18a–18p of FIG. 1.

The operation of the negative pumping circuit 20a is identical to the description of the negative pump circuit 12 depicted in FIG. 4(a) of the aforementioned prior art Ser. No. 07/964,807 and will not be repeated herein. Accordingly, the output node BB of the first stage 301 will be pumped to approximately −3 volts by the clock signals PHI1 and PHI2A. The output node D of the second stage 302 will be pumped to a high negative potential of approximately −6 volts by the clock signals PHI2 and PHI1A. The output node G of the third stage 303 will reach an even higher negative voltage of approximately −8.5 volts due to the clock signals PHI1 and PHI2A. The fourth stage 304 will cause its output node J to be pumped to approximately −11 volts by the clock signals PHI1A and PHI2. The output node J is passed through the output transistor 305 so as to generate the relatively high primary negative voltage NEGP (−10.5 V) on the output line 26a. The output buffer stage 306 is used to further generate the secondary negative voltage NEGSm on the output line 30a which is at approximately −14 volts.

Figure 4B:
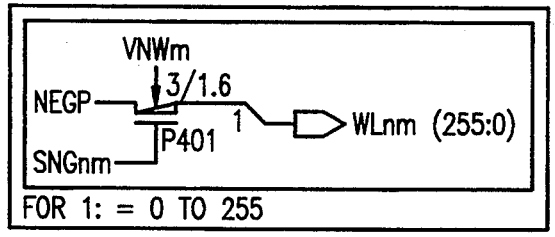
FIG. 4(b) is a circuit diagram, illustrating how the primary negative voltage NEGP is coupled to the wordlines.

Since the distribution sector pump circuits 18a–18p are identical in their construction and operation, it will be sufficient to describe only the sector pump circuit 18a. Referring now to FIG. 4(a), there is shown a detailed schematic circuit diagram of the sector pump circuit 18a. The sector pump circuit includes a relatively small-size, single-stage charge pump 400 which is used to generate a select control voltage SNGm, if a sector is selected, in response to the secondary negative voltage NEGSm from the main negative pump circuit 16. The voltage SNGm is slightly more negative than the secondary voltage NEGSm. The select control voltage SNGm is connected to the gates of a plurality of P-channel wordline pass transistors P401, one for each of the word-lines (i.e., 256 wordlines) per sector, as illustrated in FIG. 4(b). The source of the pass transistor P401 is connected to the primary negative voltage NEGP, and the drain thereof is connected to a corresponding one of the 256 wordlines WLnm. Accordingly, it can be seen that the select control voltage is used to selectively distribute or pass the primary negative voltage NEGP to the word-lines of the selected sector.

The sector pump circuit 18a includes a pair of cross-coupled input transistors 401, 402; pass transistors 403, 404; initialization transistors 404, 406; output transistors 407, 408; and capacitors C401–C403, C404–C406. One side of the capacitors C401–C403 and C404–C406 is connected to receive a respective one of the biphase clock signals SCAnm and SCBnm. The other side of the capacitor C401–C403 is connected to the node SN1, and the other side of the capacitor C404–C406 is connected to the node SN2. It will be noted that the N-wells of the capacitors are also switched by the biphase clock signals so as to reduce parasitic capacitance as well as to enhance the coupling capacitance. The cross-coupled input transistors 401 and 402 have their source connected together and receive the secondary negative voltage NEGSm on node 410. The input transistors serve to provide cancellation of the threshold voltage drop $V_{tp}$ across the corresponding pass transistors 403 and 404. Due to the high negative voltage appearing on the nodes SN1 and SN2, it can be seen that the capacitor C402, C403 and C405, C406 are stacked. The diode-connected transistors 405, 406 serve to pre-charge the respective nodes SN1 and SN2. The diode-connected transistors 407, 408 are used to create a threshold drop from the respective nodes SN1 and SN2 to the output node 412, which provides the select control voltage SNGnm.

The sector pump circuit 18a also includes a diode-connected chain 414 formed by transistors 415–418; a junction diode PJTCHL; protection transistors 419–421; a transistor chain 422 formed by transistors 423–426; and clamping transistors 426, 427. For the unselected sectors, the sector pump select signal PSnm will be low which turns on the transistor 417 causing the node PJD to be at $\phi$ volts. Since the negative protection voltage VNPE will be at approximately −6 volts when the primary negative voltage is at approximately −10.5 volts, the transistor 424 will be turned on so as to cause the selected control voltage SNGnm at the output node 412 to be clamped at about −4 V. The transistors 426, 427 are used to clamp the node 412 from going too negative for the selected sector pumps. Thus, the wordlines for the unselected sectors will not fall below −3 volts.

Further, after erase the sector select signal PSnm will go low for all sectors. Therefore, the path through the diode-connected chain and the transistor chain will also serve to discharge the node SN1 and SN2 and the select control voltage SNGnm. After a partial discharge of the output nodes in the main negative pump circuit 16, the secondary negative voltage NEGSm is raised to the power supply potential VCC. As a result, the transistors 419–421 will be conductive so as to pull up the node 412 and the select control voltage SNGnm to the power supply potential VCC for discharging the nodes SN1 and SN2. The negative protection voltage VNPE is used to protect the oxides of certain transistors in the sector pump circuit since the voltages NEGSm and SNGNm will go below −13 volts for the selected sector pumps. The transistor 420 has its gate connected to the ground potential VSS so as to turn off the current path from the supply potential VCC through the nodes PJD and 412 to the node 410 for the unselected sectors.

Figure 5:
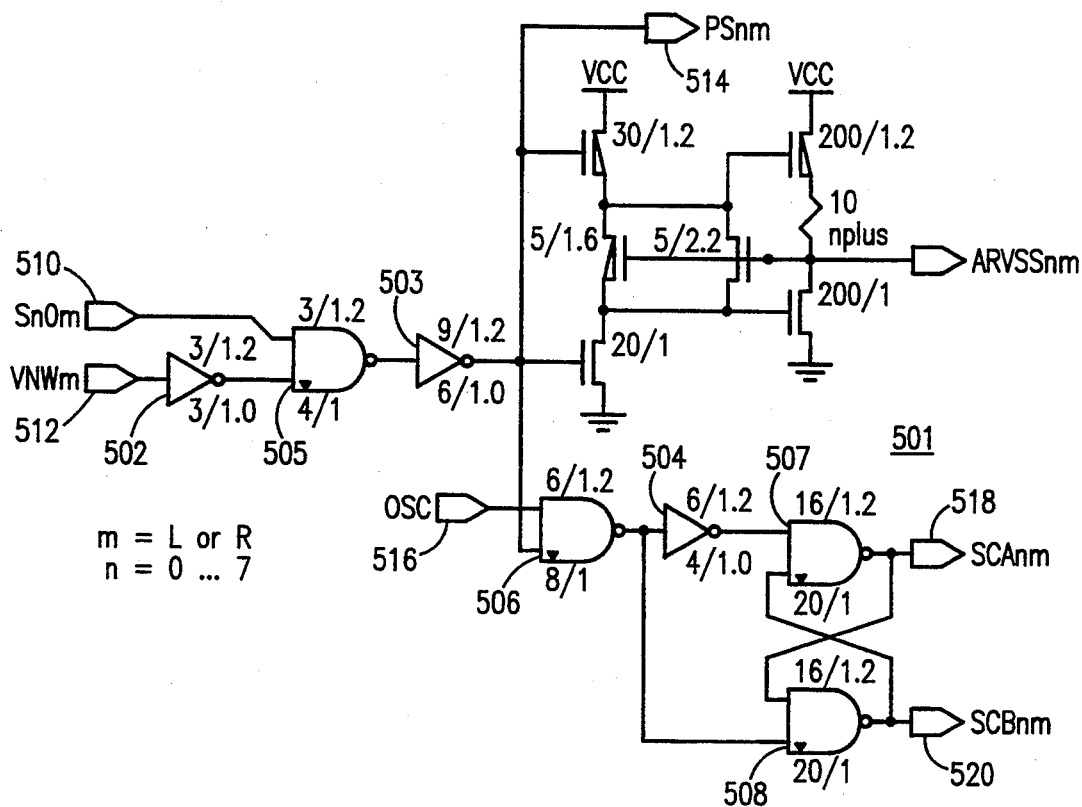
FIG. 5 is a schematic circuit diagram of one of the 16 sector logic circuits for generating the non-overlapping clock signals and the half-sector select signals.

FIG. 5 is a circuit diagram of one of the 16 sector logic circuits 501 each being associated with one of the 16 sector pump circuits 18a–18p. The sector logic circuit 501 is used to generate the pump select signal PSnm and the non-overlapping biphase clock signals SCAnm and SCBnm for the sector pump circuit 18a. The sector logic circuit includes inverter gates 502–504 and NAND logic gates 505–508. The NAND gate 505 has its one input connected to receive a sector select signal SnOm on terminal 510 and its other input connected to receive the negative well voltage VNWm on terminal 512 via the inverter 502. The output of the NAND gate 505 is passed through the inverter 503 whose output is connected to the terminal 514 for generating the pump select signal PSnm. The NAND gate 506 has its one input connected to receive the pump select signal PSnm and its other output connected to receive a 20 MHz input clock signal OSC on terminal 516. The cross-coupled NAND gates 507 and 508 are used to generate the biphase clock signal SCAnm on terminal 518 and the biphase clock signal SCBnm on terminal 520. For the selected sectors, the signal SnOm will be high and the negative well signal VNWm will be low during the erase mode. Thus, the pump select signal PSnm will be high for the selected sectors. The pump select signal PSnm is used to permit the input clock signal OSC to pass through the NAND gate 506 for generating the non-overlapping clock signals SCAnm and SCBnm. For the non-selected sectors, the pump select signal PSnm will be low and the non-overlapping clock signals will not be produced.

Figure 6:
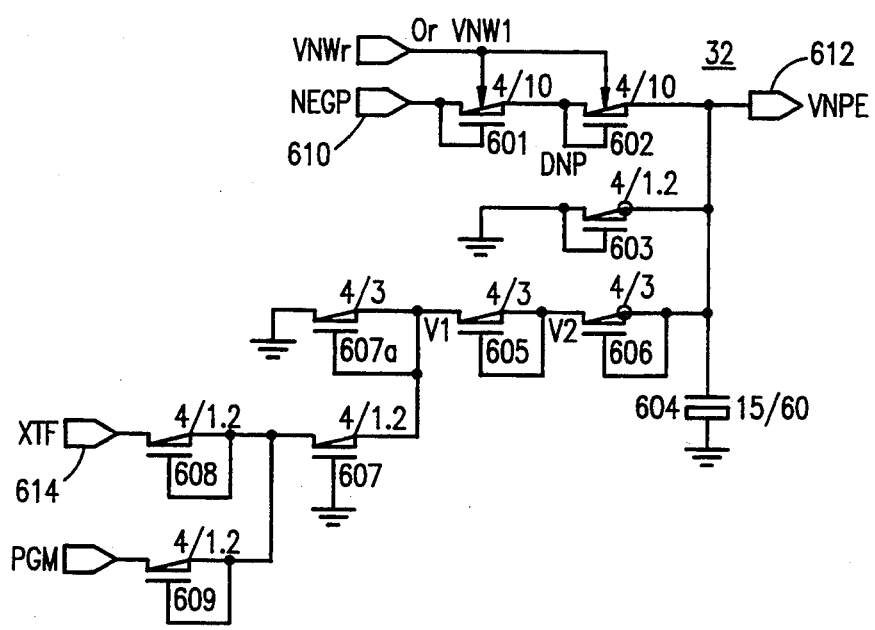
FIG. 6 is a schematic circuit diagram of the protection circuit of FIG. 2 for generating the protection signal VNPE.

FIG. 6 is a schematic circuit diagram depicting circuitry for the protection circuit 32 of FIG. 2. The protection circuit includes a first pair of level-shifting transistors 601, 602; a first clamping diode-connected transistor 603; a filter capacitor 604; a second pair of level-shifting transistors 605, 606; a second clamping diode-connected transistor 607a; and discharge transistors 607–609. The protection circuit receives the primary negative voltage NEGP on terminal 610 which is passed through the transistor 601 and 602 to the output terminal 612 for generating the protection voltage VNPE. During erase, the primary negative voltage NEGP will be about −10.5 volts and the protection voltage VNPE will be approximately −6 volts. This intermediate negative protection voltage VNPE is used to protect the oxides of the various transistors whose source/drain fall below −13 volts. After erase, the signal XTF on terminal 614 is made high so as to turn on the transistor 607 causing the voltage VNPE on the terminal 612 to be discharged. The transistor 603 serves to clamp the terminal 612 to a small positive voltage. The capacitor 604 is used to eliminate any capacitively projected noise so as to avoid disturbances.

Since the negative well circuits 34a and 34b are identical in their construction and operation, only the negative well circuit 34a will be described in detail. The negative well circuit 34a of FIG. 2 is illustrated by the circuit diagram of FIG. 7. The negative well circuit 34a includes pull-up transistors 701, 706; protection transistors 702,703,707; pull-down transistor 704; a diode-connected transistor 705; and an inverter formed by transistors 708, 709. The transistor 701 has its gate connected to receive the erase signal ER, and the transistor 706 has its gate connected to receive the erase select signal ERSEL, which is the delayed version of the erase signal ER. During the time when the signal ERSEL is high and the erase signal ER is low, the transistors 701–704 will be conductive so as to cause the discharge signal NPDm on terminal 710 to be at approximately −2.5 V since the voltage VNPE is at −6 V and voltage NEGP is at −10.5 V. This is done so as to prevent the node 710 from being pulled up immediately to the power supply potential VPP. After a predetermined time, the signal ERSEL will go low. During this time the voltage NEGP on terminal 712 will be discharging and the transistor 705 will cause the voltage NEGSm on terminal 714 to be pulled up with it. When the signal ERSEL goes low, the voltage NPDm on the node 710 will be pulled all the way to the power supply potential VPP via the transistor 708. It should be noted that the supply potential VPP will be the same as the supply potential VCC (i.e., −5 volts).

During erase, it will also be noted that the erase signal ER applied to the terminal 716 will be high so as to pull the terminal 718, which is the N-well voltage VNWm, to the lower power supply potential VSS (0 volts) for reducing the voltage across the junction. After erase, the secondary negative voltage NEGSm is pulled to the power supply potential VPP via the transistors 708, 706, and 707 so as to turn off the sector pumps. The transistor 702 is used to protect the pull-up transistor 701, and the transistor 703 is used to protect the pull-down transistor 704 since the voltage NEGSm goes lower than −13 volts which would cause overstress.

The negative regulator circuit 24 of FIG. 2 is illustrated in the circuit diagram of FIG. 8. The regulator circuit is used to regulate the erase field by controlling the primary negative voltage NEGP on the node 28 so that it is independent of the external power supply potential VCC. The regulator circuit includes a reference circuit 801, a pre-charge circuit 802, a differential comparator 803, a pull-up transistor 804, and diode-connected transistors 805, 806. During erase, a voltage VCCDIV will be developed on the node 808 and a voltage NEGDIV will be developed on the node 810. The differential comparator 803 compares the voltage NEGDIV to the voltage VCCDIV and generates a negative comparator output signal NEGCOMP on line 812. When the voltage NEGDIV is greater than the voltage VCCDIV, the comparator output signal NEGCOMP will be high thereby turning off the P-channel pull-up transistor 804. When the voltage NEGDIV is smaller than the voltage VCCDIV, the output signal NEGCOMP will be low so as to turn on the transistor 804, causing the terminal 814 to be connected to the power source potential VCC. As a result, the negative voltage NEGP of the main pump circuit 20a will be pulled up.

Figure 9:
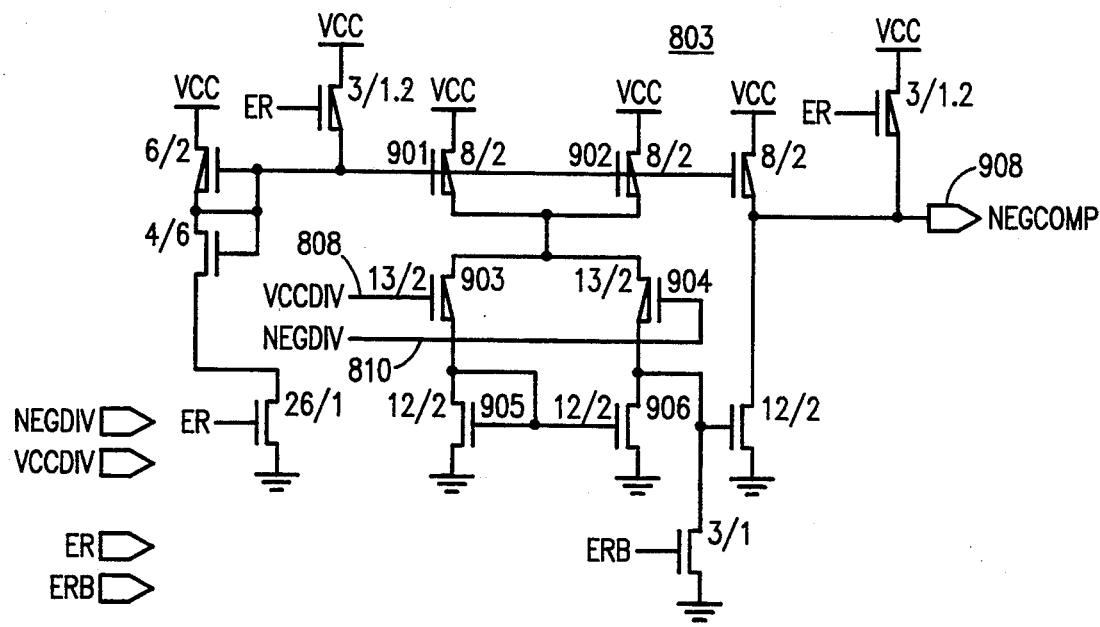
FIG. 9 is a detailed circuit diagram of the negative comparator circuit of FIG. 8.

In FIG. 9, there is shown a detailed schematic circuit diagram of the differential comparator of FIG. 8. The differential comparator includes current source transistors 901, 902; input transistors 903, 904; and load transistors 905, 906. The gate of the input transistor 903 is connected to the node 808 for receiving the voltage VCCDIV, and the gate of the input transistor 904 is connected to the node 810 for receiving the voltage NEGDIV. The output terminal 908 of the differential comparator 803 provides the output signal NEGCOMP.

Figure 10:
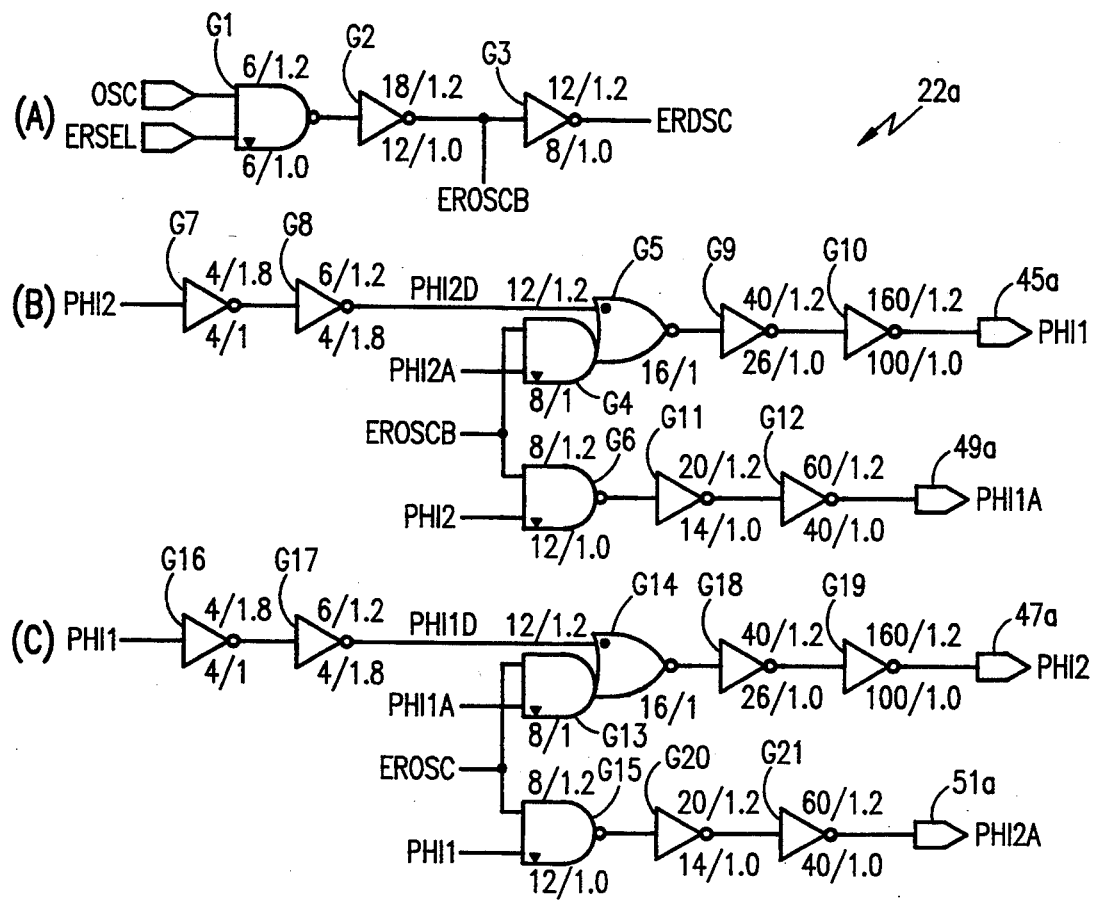
FIGS. 10(a)–10(c) are circuit diagrams of the negative clock circuit of FIG. 2 for generating the four-phase clock signals.
Figure 11:
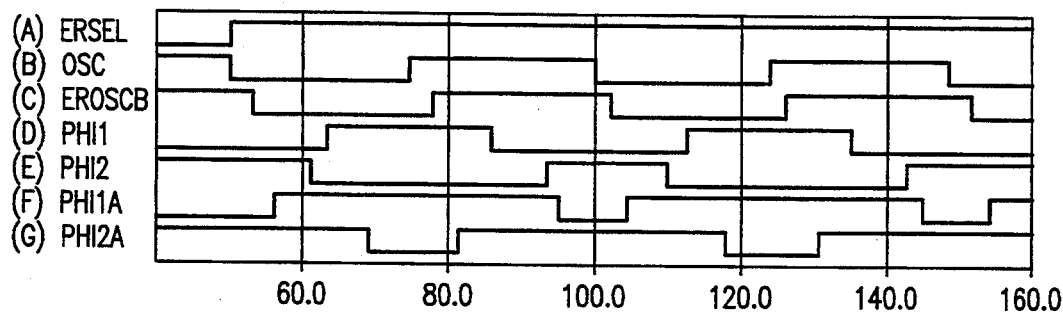
FIG. 11(a–g) are timing -diagrams of the various control signals and clock signals in FIG. 10.

In FIGS. 10(a)–10(c) there are circuit diagrams of the negative clock circuit 22a of FIG. 2. The negative clock circuit 22a is used to generate the clock waveforms PHI1, PHI2, PHI1A, and PHI2A which are coupled to the nodes 45, 47, 49 and 51, respectively of FIG. 2. In FIG. 10(a), the signal EROSCB is generated in response to the input clock signal OSC and the erase select signal ERSEL. The circuit of FIG. 10(a) includes a NAND logic gate G1 and inverter gates G2, G3. In FIG. 10(b), the clock signal PHI1 on terminal 45a is generated in response to the input signals PHI2, EROSCB and PHI2A, and the clock signal PHI1A on terminal 49a is generated in response to the input signals EROSCB and PHI2. The circuit of FIG. 10(b) includes an AND logic gate G4, a NOR logic gate G5, a NAND logic gate G6, and inverter gates G7–G12. In FIG. 10(c), the clock signal PHI2 on terminal 47a is generated in response to the input signals PHI1, PHI1A and EROSC, and the clock signal PHI2A on terminal 51a is generated in response to the input signals EROSC and PHI1. The circuit of FIG. 10(c) includes an AND logic gate G13, a NOR logic gate G14, a NAND logic gate G15, and inverter gates G16-G21.

The operation of the distributed negative gate power supply 10 of FIG. 1 will now be described with reference to the timing diagrams of FIG. 11(a)-11(g) and the waveforms of FIG. 12. The negative clock circuit 22a receives the 20 MHz clock signals (FIG. 11(b)) on line 41 and the erase select signal ERSEL (FIG. 11(a)) on line 43. In response to these input signals, the waveforms of the clock signals PHI1, PHI2, PHI1A and PHI2A are generated at the output lines 45-51, which are shown in FIGS. 11(d)-11(g). The negative well circuit 34a receives as its input the erase signal ER on line 52, the erase select signal ERSEL on line 54, and the protection voltage VNPE on line 56. It will be recalled the erase select signal ERSEL is a delayed version of the erase signal ER.

Figure 12:
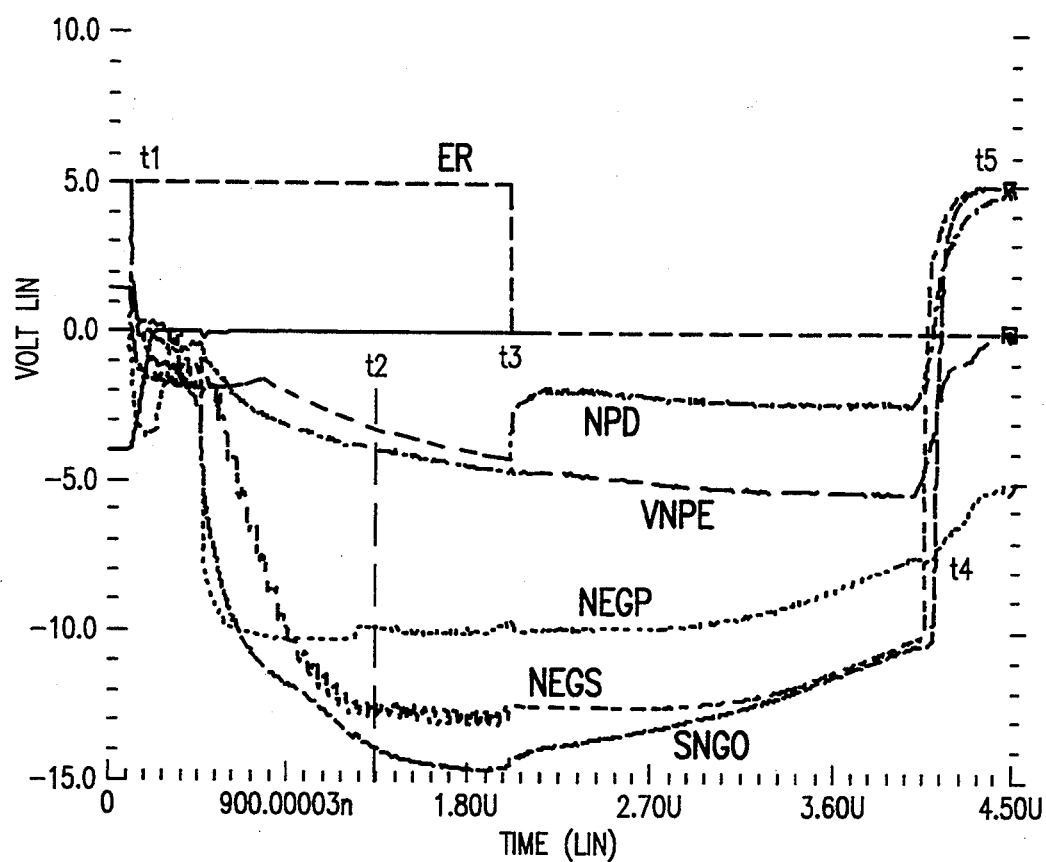
FIG. 12 is a timing diagram illustrating the state of various signals in FIG. 2, useful in understanding the operation of the present invention.

During the erase mode, the erase signal ER will go high which is shown in FIG. 12 at time t1. This erase sinal ER is also applied via line 58 to the gate of the N-channel transistor 307 in the main pump circuit 20a (FIG. 3). As a result, the transistor 307 will be turned on so as to provide a current path to the lower power supply potential VSS(gnd). This will, in turn, cause the negative charge pumping circuit 20a in the main pump circuit to being working and pumping the primary negative voltage NEGP on the line 26a to approximately −10.5 volts at time t2. The secondary negative voltage NEGS on the line 30a will follow the primary negative voltage and will charge to approximately −13 volts at the time t2.

For the selected sectors, the associated distribution sector pump 18a (FIG. 4(a)) will be working and pumping so as to produce the select control signal SNG, which is approximately −14 volts. This select control signal SNG is applied to the wordline passgate transistor (FIG. 4(ba)) so as to pass the primary negative voltage NEGP to the 256 wordlines WLnm in that sector without a threshold drop. The protection circuit 32 receives as its input a negative well voltage VNW and the primary negative voltage NEGP on lines 60 and 62, respectively. In response to these input signals, the protection voltage VNPE on the line 64 is pulled to be below the ground potential during erase so as to reduce the field across the gate oxide of the transistors in the negative well circuit 34a. The protection circuit receives the signal XTF on line 66 and is used to discharge the protection voltage VNPE during the non-erase mode. It will be noted that the signal NPD on line 68 at the output of the negative well circuit 34a is also pulled low (i.e., −5 volts) during erase.

When the erase signal ER goes low after erase at time t3, the signal NPD is pulled up only to approximately −2.5 volts at time t3 so as to protect the gate oxides since the negative voltages NEGP, and NEGS are still quite high. After the primary negative voltage NEGP has been allowed to discharge to approximately −8 volts (or higher, i.e., −3 volts) at time t4, the signal NPD will only then be pulled up to the final value of +5.0 volts at time t5. In this manner, the gate oxides of the transistors in the negative pumping circuit 20a will not be overstressed.

From the foregoing detailed description, it can thus be seen that the present invention provides a distributed negative gate power supply for generating and selectively supplying a relatively high primary negative voltage to control gates of memory cells in selected half-sectors via wordlines in an array of flash EEPROM memory cells during flash erasure. The distributed negative power supply includes a main charge pumping circuit and a plurality of distribution sector pumps. The main charge pump circuit is used to generate the primary negative voltage. Each of the plurality of distribution section pumps is responsive to half-sector pump select signals for selectively connecting the primary negative voltage to the wordlines of the selected half-sectors.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A distributed negative gate power supply for generating and selectively supplying a high negative voltage to control gates of memory cells in selected half-sectors via wordlines in an array of flash EEPROM memory cells during flash erasure, said distributed negative gate power supply comprising:

clock means (22a, 22b) for generating a plurality of clock signals;

main charge pumping means (20a, 20b) responsive to an external power supply potential and to said plurality of clock signals for generating a high primary negative voltage;

sector logic means (501) for generating half-sector pump select signals, each corresponding to a selected half-sector; and distribution sector pumping means (18a-18p) responsive to said half-sector select signals for selectively connecting said primary negative voltage to the wordlines of the selected half-sectors.

2. A distributed negative gate power supply as claimed in claim 1, wherein said distribution sector pumping means is comprised of a plurality of distribution sector pump circuits, each being formed of a small-size, single-stage pump.

3. A distributed negative gate power supply as claimed in claim 2, wherein each pump stage is responsive to a secondary high negative voltage associated with said primary negative voltage so as to generate a select control signal.

4. A distributed negative gate power supply as claimed in claim 3, wherein said distribution sector pumping means includes a plurality of pass transistors each having its source connected to receive said primary negative voltage, each gate connected to receive said select control signal, and its drain connected to one of said plurality of wordlines in said selected half-sectors.

5. A distributed negative gate power supply as claimed in claim 4, wherein said primary negative voltage is approximately −10.5 volts.

6. A distributed negative gate power supply as claimed in claim 5, wherein said select control signal has a voltage value of approximately −14 volts.

7. A distributed negative gate power supply as claimed in claim 1, wherein said main charge pumping means is formed of a plurality of charge pump stages (301–304).

8. A distributed negative gate power supply as claimed in claim 7, further comprising regulation means (24) responsive to said primary high negative voltage and a reference potential for generating a negative comparator signal which is either at a high level so as to allow said main charge pumping means to increase said primary negative voltage or is at a low level so as to decrease said primary negative voltage.

9. A distributed negative gate power supply as claimed in claim 1, further comprising means for generating a discharge voltage which is initially pulled up to a small negative voltage so as to allow said primary negative voltage to discharge sufficiently before said discharge voltage is pulled to the external power supply potential thereby avoiding excessive stress on the oxides.

10. In an array of flash EEPROM memory cells formed on the substrate to define columns and rows, where the substrate includes a common source line extending along at least one of the rows, a plurality of bit lines extending along respective columns, where each memory cell includes an N-type source region coupled to the common source line, a control gate, a floating gate, a channel region and an N-type drain region coupled to a respective one of the bit lines, where each memory cell is erasable predominately by tunneling electrons from its floating gate to its source region, and a distributed negative gate power supply for generating and selectively supplying a high primary negative voltage to control gates of memory cells in selected half-sectors via the wordlines during flash erasure, said distributed negative gate power supply comprising:
   clock means (22a, 22b) for generating a plurality of clock signals;
   main charge pumping means (20a, 20b) responsive to an external power supply potential and to said plurality of clock signals for generating a high primary negative voltage;
   sector logic means (501) for generating half-sector pump select signals, each corresponding to a selected half-sector; and
   distribution sector pumping means (18a–18p) responsive to said half-sector select signals for selectively connecting said primary negative voltage to the wordlines of the selected half-sectors.

11. A distributed negative gate power supply as claimed in claim 10, wherein said distribution sector pumping means is comprised of a plurality of distribution sector pump circuits, each being formed of a small-size, single-stage pump.

12. A distributed negative gate power supply as claimed in claim 11, wherein each pump stage is responsive to a secondary high negative voltage associated with said primary negative voltage so as to generate a select control signal.

13. A distributed negative gate power supply as claimed in claim 12, wherein said distribution sector pumping means includes a plurality of pass transistors each having its source connected to receive said primary negative voltage, each gate connected to receive said select control signal, and its drain connected to one of said plurality of wordlines in said selected half-sector.

14. A distributed negative gate power supply as claimed in claim 13, wherein said primary negative voltage is approximately −10.5 volts.

15. A distributed negative gate power supply as claimed in claim 14, wherein said select control signal has a voltage value of approximately −14 volts.

16. A distributed negative gate power supply as claimed in claim 10, wherein said main charge pumping means is formed of a plurality of charge pump stages (301–304).

17. A distributed negative gate power supply as claimed in claim 16, further comprising regulation means (24) responsive to said primary high negative voltage and a reference potential for generating a negative comparator signal which is either at a high level so as to allow said main charge pumping means to increase said primary negative voltage or is at a low level so as to decrease said primary negative voltage.

18. A distributed negative gate power supply as claimed in claim 10, further comprising means for generating a discharge voltage which is initially pulled up to a small negative voltage so as to allow said primary negative voltage to discharge sufficiently before said discharge voltage is pulled to the external power supply potential thereby avoiding excessive stress on the oxides.

19. A distributed negative gate power supply for generating and selectively supplying a high negative voltage to control gates of memory cells in selected half-sectors via wordlines in an array of flash EEPROM memory cells during flash erasure, said distributed negative gate power supply comprising:
   main charge pumping means (22a, 22b) responsive to an external power supply potential (VCC) and to clock signals for generating a high primary negative voltage; and
   distribution sector pumping means (18a–18p) responsive to half-sector select signals for selectively connecting said primary negative voltage to the wordlines of the selected half-sectors.

* * * * *

UNITED STATES PATENT AND TRADEMARK OFFICE
CERTIFICATE OF CORRECTION

PATENT NO. : 5,406,517
DATED : April 11, 1995
INVENTOR(S) : Chung K. Chang et al.

It is certified that error appears in the above-identified patent and that said Letters Patent is hereby corrected as shown below:

Column 1, line 18, after "In", insert -- co-pending --.

Column 8, line 26, change "φ" to -- ∅ --.

Signed and Sealed this

Eleventh Day of July, 1995

Attest:

BRUCE LEHMAN

Attesting Officer        Commissioner of Patents and Trademarks